United States Patent [19]

Bahrle et al.

[11] Patent Number: 4,705,592
[45] Date of Patent: Nov. 10, 1987

[54] PROCESS FOR PRODUCING PRINTED CIRCUITS

[75] Inventors: Dieter Bahrle, Schönaich; Friedrich Schwerdt; Jurgen H. Stehling, both of Herrenberg, all of Fed. Rep. of Germany

[73] Assignee: International Business Machines Corporation, Armonk, N.Y.

[21] Appl. No.: 943,227

[22] Filed: Dec. 18, 1986

[30] Foreign Application Priority Data

Dec. 30, 1985 [EP] European Pat. Off. ........ 85116653.8

[51] Int. Cl.[4] ............................ C23F 1/02; B44C 1/22; C03C 15/00; C03C 25/06
[52] U.S. Cl. ...................................... 156/630; 29/852; 156/634; 156/656; 156/666; 156/902; 204/15; 204/192.14; 252/79.2
[58] Field of Search ................ 156/630, 631, 632, 634, 156/645, 656, 659.1, 666, 902, 150, 151; 252/79.2; 29/852; 204/15, 32.1, 192.1, 192.14, 192.15, 192.3; 174/68.5; 430/313, 314, 315, 318; 427/97

[56] References Cited

U.S. PATENT DOCUMENTS

| | | | |
|---|---|---|---|
| 2,982,625 | 5/1961 | Saubestre | 41/42 |
| 3,675,318 | 7/1972 | Merkenschlager | 29/624 |
| 4,521,280 | 6/1985 | Bahrle et al. | 204/15 |
| 4,556,628 | 12/1985 | Greschner et al. | 430/314 |
| 4,581,301 | 4/1986 | Michaelson | 428/551 |

FOREIGN PATENT DOCUMENTS

| | | |
|---|---|---|
| 1496984 | 11/1969 | Fed. Rep. of Germany . |
| 2135384 | 2/1973 | Fed. Rep. of Germany . |
| 2515706 | 10/1976 | Fed. Rep. of Germany . |
| 3304004 | 8/1984 | Fed. Rep. of Germany . |
| 1588780 | 4/1981 | United Kingdom . |

OTHER PUBLICATIONS

Czepluch, Method of Improving the Adhesion of Metallic Layers on Curable Plastics, IBM TDB, 11/84, vol. 27, No. 6, pp. 3208-3209.
Schneider et al., Method of Producing Printed Circuits by the Additive Process, IBM TDB, vol. 26, No. 8, 2/84, p. 4816.

Primary Examiner—William A. Powell
Attorney, Agent, or Firm—Manny W. Schecter; Maurice H. Klitzman; Shelley M. Beckstrand

[57] ABSTRACT

A process for producing printed circuits including a dry substrate activation process and copper deposition without electroless plating is disclosed. The process requires fewer wet chemical baths, is less environmentally hazardous, and more efficient than conventional processes. Initially, sacrificial copper layers are laminated to the surface of a prepreg substrate and through holes are drilled therein. The sacrificial layer is then removed by etching and copper is sputter deposited upon the substrate surface and the walls of the through holes. Photoresist is then applied, exposed and developed to create the desired pattern of circuit lines. Next, copper is deposited in the photoresist channels and on the through hole walls by electroplating. After the photoresist is stripped, the exposed sputtered copper is removed by differential etching.

17 Claims, 9 Drawing Figures

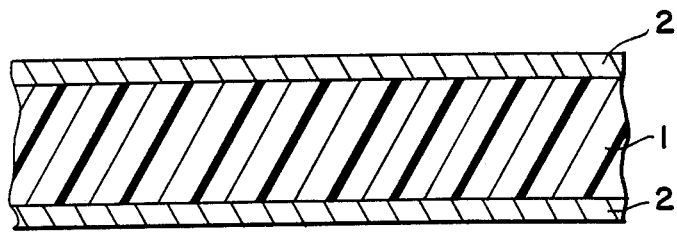
FIG. IA
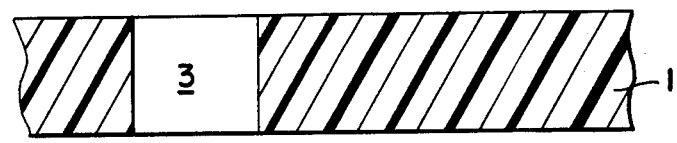
FIG. IB
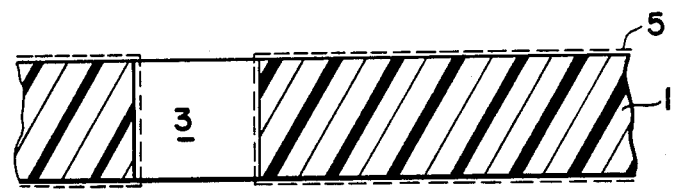
FIG. IC
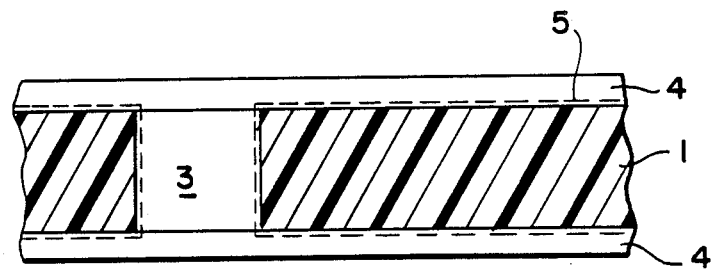
FIG. ID

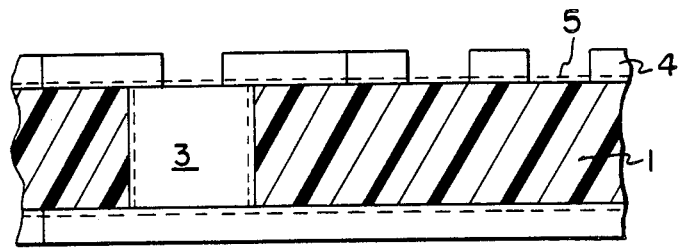
FIG. IE
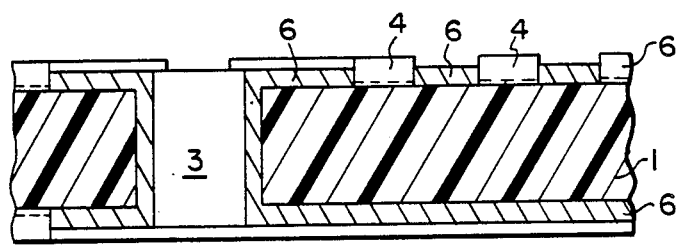
FIG. IF
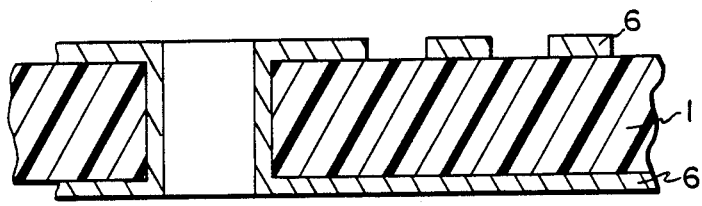
FIG. IG

PROCESS FOR PRODUCING PRINTED CIRCUITS

BACKGROUND OF THE INVENTION

1. Field of the Invention

This invention relates to a process for producing printed circuits. More particularly, the invention relates to a process for producing printed circuits in which the insulating substrate is activated by a dry process and in which electroless plating of the conductive circuit lines is eliminated.

2. Description of the Related Art

During conventional production of multilayer circuit boards, conductors are distributed on several signal planes which are interposed with insulating layers and the necessary number of power planes to form a multilayer circuit board. The multilayer circuit board is subsequently drilled in the desired places and connection to the internal wiring is established through copper plating of the drilled holes. Because of the high wiring density, the materials and processes used to produce multilayer circuit boards must meet very stringent requirements.

Two common techniques for producing multilayer circuit boards are the subtractive and additive methods. Power planes are typically produced by the subtractive method. The starting material in this method is an insulating substrate material, such as glass fiber reinforced with epoxy resin, commonly known as prepreg. A copper layer is laminated to one or both sides of the substrate. In the course of further processing, several such substrates are packaged and through holes are drilled by numerically controlled automatic equipment. A copper base layer is deposited on the hole walls by purely chemical means and then reinforced by electroplating. A photoresist pattern is then photolithographically generated on the surface of the copper-laminated substrates in those areas where the required conductive circuit lines are to be formed. The individual circuit board is then fed through an etch system where the copper layer is etched off in the regions that are not protected by photoresist. After removal of the residual resist, only the circuit lines of the printed circuits are left on the epoxy resin substrate.

The subtractive method has the disadvantage that a relatively thick layer of copper has to be laminated to the insulating substrate, most of the copper layer being removed upon subsequent etching. In addition, substantial undercutting occurs during etching, thereby limiting the conductor width such that those of less than 100 microns cannot be produced by this method.

Signal planes for multilayer circuit boards, requiring increasingly dense printed circuit patterns, are typically produced by the additive method. The additive method is time-consuming, extremely complicated, and includes several wet chemical baths. The additive method will now be described in detail with reference to the left side of the flowchart of FIGS. 2A and 2B.

The starting material for the additive method is again an insulating substrate material, such as prepreg. Layers of copper (totalling approximately 75 microns in thickness) are laminated to both sides of the substrate. Approximately 70 microns of the copper are subsequently removed by a known technique, such as etching. The surfaces of the circuit board are then ground, cleaned, and dried. For increased stability, a negative photoresist is applied and blanket exposed. After registration holes have been punched, through holes are drilled and cleaned. The walls of the drilled holes are then activated with a palladium chloride-tin-(II)-chloride solution, and the negative resist is stripped off. Next, the surfaces of the circuit board are treated with a benzotriazole bonding agent and coated with a layer of negative photoresist which is exposed according to the desired conductive circuit pattern and then developed. The circuit board is thus prepared for deposition of the copper circuit lines.

Copper is deposited on the circuit board by the immersion thereof in a long-life copper bath for about 20 hours. During that time, copper is electrolessly deposited to the desired thickness of approximately 40 microns in the developed circuit line channels on the 5 microns thick copper layer and on the hole walls. After the copper is deposited, a tin coating is applied to the copper circuit lines and the photoresist is stripped off. The thin copper layer is then etched in the regions where there are no tin-coated circuit lines. The protective tin coating is subsequently removed and the manufacturing process terminates with an inspection and an electrical test of the printed circuits.

The above-described additive method has the disadvantage that the hole walls to be copper-plated have to be activated with a palladium chloride-tin-(II)-chloride solution, otherwise no copper would be deposited thereon, thereby resulting in defects in the finished printed circuits. Such wet activation processes are inefficient and pose environmental hazards. Also, through holes cannot be drilled without first applying a photoresist and photolithographically exposing it. In addition, the additive method requires the use of electroless plating techniques. Electroplating cannot be used to deposit the copper because the conductive material deposited on the hole walls during activation is not thick enough to allow for a continuous current adequate for electroplating. The photoresist materials used in additive methods must therefore be resistant to superalkaline electroless plating baths. These requirements are generally satisfied only by photoresists that are soluble in organic solvents, such as chlorinated hydrocarbons, and which are developed and stripped by such solvents. The use of chlorinated hydrocarbons pose another environmental hazard. Electroless plating is also a much slower process than electroplating. Finally, the conductive circuit lines produced by the additive method must be provided with a protective tin coating during etching of the 5 microns copper layer. Otherwise, the circuit lines would also be etched. The provision of the tin coating adds to the cost and complexity of the process.

Another additive process for producing printed circuits is known. Sacrificial copper layers are laminated to both sides of a synthetic resin prepreg substrate, through holes are drilled, and the sacrificial layers are removed by etching. A layer of negative photoresist is then directly laminated to one or both sides of the prepreg, which has been roughened by etching. After a pattern has been generated in the negative photoresist layer, copper is cathode sputtered onto the circuit board, including the surfaces of the through holes, the photoresist channels defining the conductive circuit pattern. The copper sputtered onto the surface of the photoresist is removed by scrubbing. In an electroless bath, copper is then deposited by the additive method on the copper sputtered and remaining in the photoresist channels and on the walls of the through holes. Again, a significant disadvantage is that electroplating is not possible. There is no continuous conductive connection of the sputtered copper once the copper on the photoresist has been removed by scrubbing. Thus, the slower electroless plating technique must be used.

Processes for producing printed circuits which include the deposition of copper by electroplating are known. In one such process for producing printed circuits an adhesive layer is deposited on a roughened, unlaminated insulating substrate. The adhesive layer is activated by treatment with tin and palladium and then a metal coating is formed by the electroless chemical plating of a copper base layer not exceeding 0.5 microns. The copper is deposited on the entire surface, including the walls of any substrate through holes. The copper base layer is then reinforced to approximately 1 to 2 microns by electroplating. After a selective coating is applied, the copper is reinforced by further plating. Known subtractive processes are then used to remove the coating and etch away undesired portions of the copper plating.

In another process for producing printed circuits including the deposition of copper by electroplating, thin copper layers and protective layers are applied to both sides of a thin copper laminate, through holes are then drilled, and copper is deposited on the hole walls by both electroless and electroplating techniques. The protective layers are then mechanically stripped, the desired conductive circuit pattern and the hole walls are reinforced by selective copper plating using electroformed coatings, and the non-reinforced regions of the thin copper layers are removed by etching.

Another known process includes reinforcing a copper layer near through holes, including soldering pads, by electroplating. Again, electroless plating precedes electroplating.

Each of the above processes including electroplating techniques suffers from the disadvantage that electroless copper deposition is required prior to electroplating. Electroless plating is required to establish a conductive layer to which electrodes can be attached for electroplating. Furthermore, the conductive layer must be continuous or a complicated and impractical multiple-electrode arrangement is required to allow for current in the conductive layer wherever electrodeposition is desired. For the purposes of this invention, the elimination of electroless plating shall mean that electroplating be accomplished without such complex electrode arrangements.

One process for producing printed circuit boards without electroless plating is known. According to the process, a conductive seed layer is selectively applied to a substrate by a known technique, such as silkscreening. The seed layer is selectively applied according to the desired conductive circuit pattern. Copper is then electroplated directly upon the seed layer. However, the use of such a process presumes that the conductive circuit pattern, and thus also the seed layer, is continuously connected. However, modern circuit boards often require conductive circuit patterns which are not continuously connected. A multiple-electrode arrangement would be required to accomplish electroplating of such circuit boards. Thus, the need for electroless plating is not necessarily eliminated, as described previously.

SUMMARY OF THE INVENTION

In view of the foregoing, it is the principal object of this invention to improve processes for producing printed circuits.

Another object of this invention is a process for producing printed circuits which does not require the use of thick layers of copper.

Still another object of this invention is a process for producing printed circuits which minimizes the risk of substantial undercutting during etching.

Still another object of this invention is a process for producing printed circuits which minimizes the need for wet chemical baths.

Still another object of this invention is a process for producing printed circuits which eliminates the need for the application of photoresist and photolithographic masking prior to the drilling of through holes.

Still another object of this invention is a process for producing printed circuits which eliminates electroless plating.

Still another object of this invention is a process for producing printed circuits which eliminates the need for a protective tin coating on the conductive circuit lines.

These and other objects of the invention are accomplished by blanket sputtering copper onto the surface of a prepreg substrate and the walls of through holes therein after previously laminated sacrificial copper layers have been removed by etching. The prepreg surface is then selectively masked by a photoresist. Because the sputtered copper is a continuous conductive layer passing beneath the photoresist, copper can be further deposited solely by electroplating. The photoresist is then stripped, and the exposed sputtered copper is removed by differential etching.

Since the above-described process is not subtractive, the use of thick layers of copper and the risks of substantial undercutting during etching are eliminated. The use of sputtered copper to activate the prepreg is a dry process, thereby eliminating the need for wet activation processes. Since the circuit lines are produced by electroplating only, using acid baths, photoresist materials which are resistant to such acid baths and can be developed and stripped in aqueous alkaline media. The need for chlorinated hydrocarbon solvents is thus eliminated. In addition, copper electroplating is approximately 10 to 20 times faster than electroless copper plating. The plating bath is also easier to use since it is practically free from complexing agents. Finally, the use of differential etching to remove the sputtered copper layer eliminates the need for a protective tin coating on the circuit lines.

BRIEF DESCRIPTION OF THE DRAWING

FIG. 1 is a series of cross-sectional views of a circuit board manufactured according to the invention.

DESCRIPTION OF THE PREFERRED EMBODIMENT

Figure 2A:
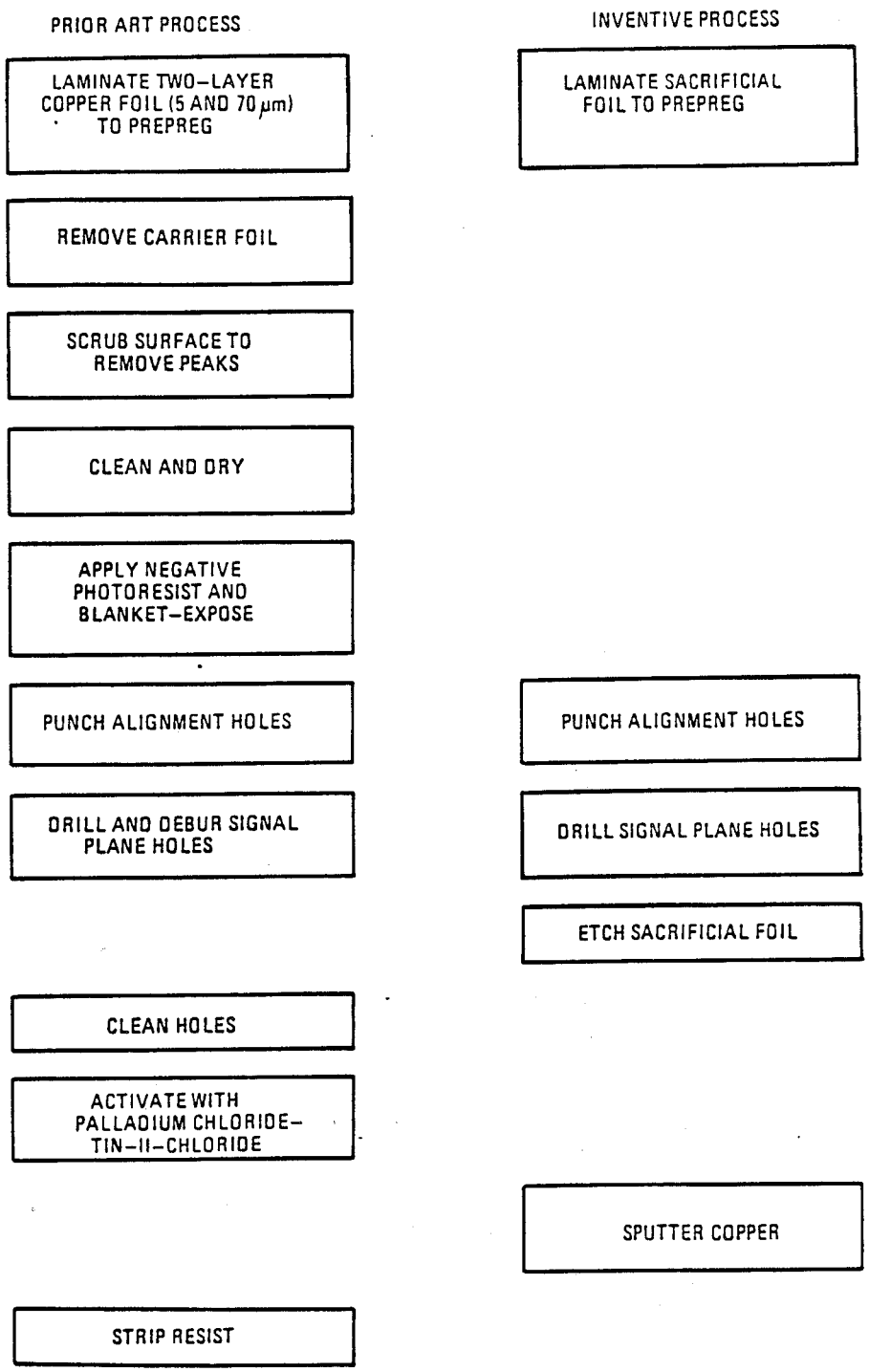
FIG. 2 is a flow chart comparison of processes for producing printed circuits according to the additive process and according to the invention.
Figure 2B:
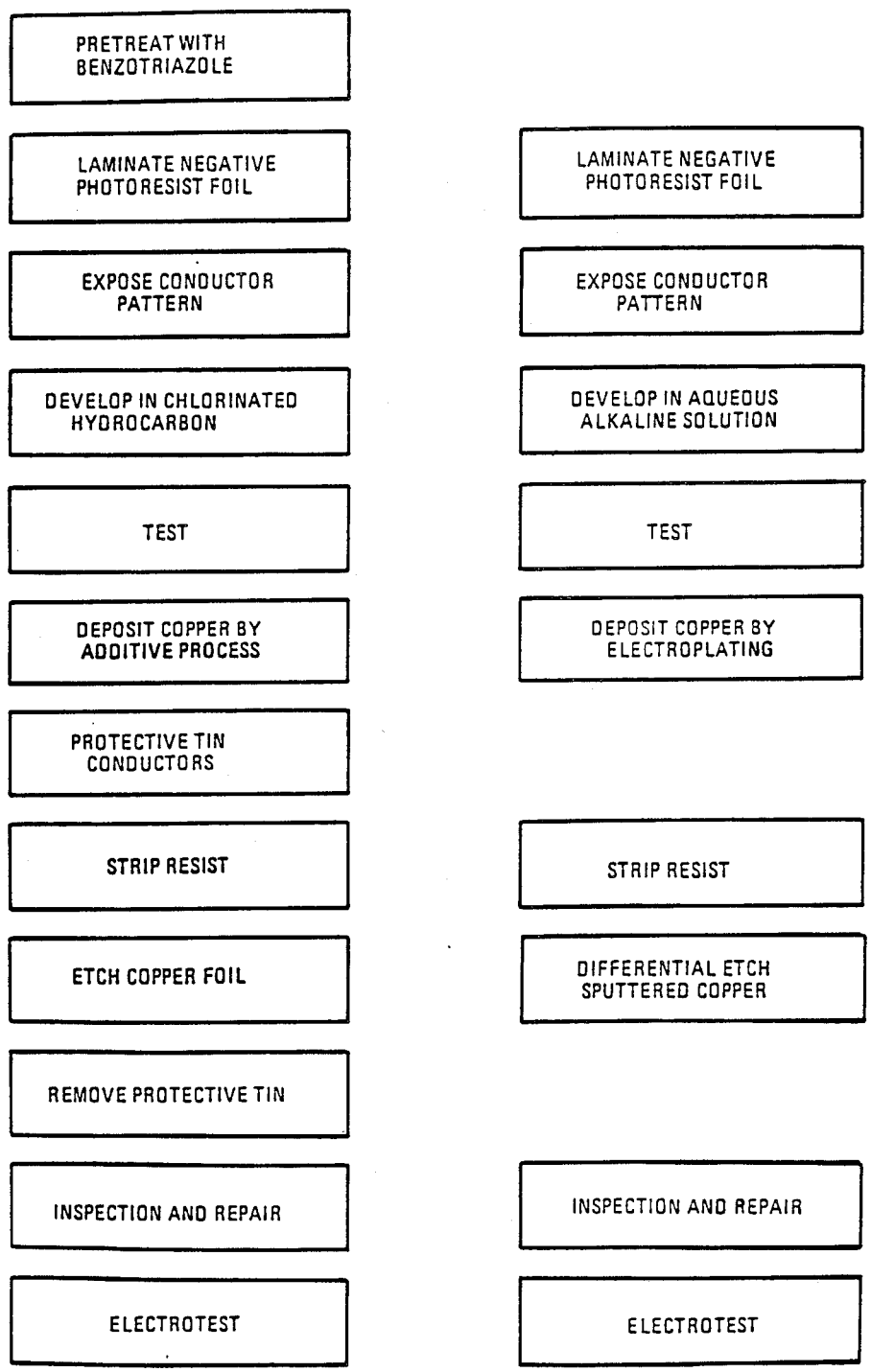

The invention will be described in detail with reference to FIGS. 1A to 1G and corresponding reference to the right side of the flow chart in FIGS. 2A and 2B. According to the present invention, insulating substrate 1 is a laminate of four greenly dyed layers of prepreg. Sacrificial layers 2 of copper are laminated to insulating substrate 1 at about 190° C. FIG. 1A shows the laminated structure. The green dye of the prepreg layers facilitates optical inspection. Sacrificial layers 2 are ½ or 1 oz. copper layers of a thickness of 0.0175 and 0.035 mm, respectively. Lamination of sacrificial layers 2 stabilizes the structure and transfers the dendritic structure of the bottom side of the copper layers to the surface of insulating substrate 1, thus roughening the surface. Registration holes (not shown) are punched into the structure.

As shown in FIG. 1B, through holes 3 are next drilled into the circuit board. This is accomplished by means of numerically controlled automatic equipment, thereby serving to eventually link the printed circuit vertically as well as horizontally. It is significant that no photoresist layer is deposited before drilling holes 3 because substrate 1 has adequate intrinsic stability as a result of sacrificial layer 2. Sacrificial layers 2 are etched away with a hydrochloric acid copper-(II)-chloride solution in a high-pressure spray system after holes 3 have been drilled, thereby eliminating the need for a separate wet cleaning step for holes 3. After etching, substrate 1 is both clean and strongly surface-roughened.

FIG. 1C shows substrate 1 after a layer of sputtered copper 5 has been blanket deposited on both sides thereof in a continuous, magnetron-enhanced high-power cathode sputtering system. Both sides are simultaneously sputtered until a copper layer thickness of about 200 nm has been obtained. The thickness of sputtered copper 5 is typically between 80 and 500 nm. Sputtered copper 5 activates substrate 1 and thereby eliminates the need for elaborate and expensive palladium-tin-(II)-chloride activation. Sample parameters for the sputtering process are as follows:

starting pressure: $\leq 5 \times 10^{-5}$ mbar; oxygen glow discharge
for cleaning: 2 minutes;
$O_2$ partial pressure: $2 \times 10^{-1}$ mbar;
argon partial pressure: $5 \times 10^{-3}$ mbar;
argon flow rate: 80–150 cm$^3$/min.
board velocity: 1–3 cm/sec.;
substrate temperature: $\leq 80°$ C.;
sputter rate: $\approx 10$ nm/sec.;
copper layer thickness: 200 nm.

As shown in FIG. 1D, a layer of negative photoresist 4 is laminated to both sides of roughened and copper-sputtered substrate 1. A suitable photoresist is one based on polyethylene terephthalate, benzophenone, and acryl acid/styrol polymer and sold by E. I. du Pont de Nemours & Company under the trademark "RISTON 3315." During lamination, which is carried out at about 110° to 120° C. and at a rate of about 1 cm/sec., photoresist 4 softens to such an extent that it forms an integral part with the roughened surface of substrate 1. It is not necessary to prepare the substrate surface with a bonding agent, such as benzotriazole, even though using that agent, in particular as an anticorrosive, may be advantageous. The front and back sides of the structure are then exposed through a mask and photoresist 4 is developed in a continuous system with an approximately 1.5 to 2 percent by weight sodium carbonate solution at about 30° to 40° C. The developer is reprocessed by flocculating the photoresist and neutralizing the residual alkalinity of the developer bath, thus eliminating exhaust air problems during development. FIG. 1E shows the circuit board after photoresist 4 has been developed.

After inspection, the circuit board is placed in a copper electroplating bath. For that purpose, the circuit board is inserted into a frame contacting all sides of the sputtered copper layer. Alternatively, an approximately 1 cm wide peripheral region of sacrificial layer 2 may be retained during the etching thereof to be used for fitting contact screws during electroplating.

As optimum operation of electroplating baths is obtained only at particular current densities, it is essential that the amount of active surface of the circuit board to be plated be accurately known. This surface consists of the image of the pattern of conductive circuit lines and the surface of holes 3. A very simple and fast method of determining the active surface uses optical means. The device employed for that purpose determines the amount of light which during illumination in front of a uniformly illuminated disk is absorbed either by the positive or the negative portion of the film image.

For copper plating, sulphuric acid baths with a low metal content and a high sulphuric acid content are used. The concentrations of the individual bath components should be within the following tolerances:

$Cu^{2+}$: 15–25 g/l
$H_2SO_4$: 170–200 g/l
$Cl^-$: 40–60 mg/l

The electrolyte may also contain a brightener, such as one comprising an amide of the general formula R-CO-NH$_2$, where R is an aliphatic or aromatic, monomeric or polymeric hydrocarbon residue, and of a polyethylene glycol and an organic sulphur compound. The brightener content of the electrolyte is preferably about 5 to 15 g/l. The operating temperature of the bath is about 20° to 25° C. For good distribution of the copper layer, particularly inside the through holes, the circuit board should be moved to and from the anodes. Movement should be at a rate of about 0.5 to 0.9 m/min., as determined experimentally. Additional electrolyte movement may be obtained by blowing in oil-free air.

The optimum cathodic current density for depositing uniform copper layers ranges from about 2.5 to 3 A/dm$^2$ and depends on the bath temperature, the rate of movement, and the geometry. At current densities of about 2.5 A/dm$^2$, a deposition or plating rate of about 25 to 30 microns/h is obtained. FIG. 1F shows the circuit board after copper layer 6 is electroplated.

After the electroplating is completed, photoresist 4 is stripped in an aqueous alkaline solution. For that purpose, an approximately 1 to 3 percent by weight sodium hydroxide solution is preferably used. After the photoresist has been stripped, exposed sputtered copper 5 is removed by differential etching. The etching solution used for that purpose contains about 100 to 130 g/l sodium peroxodisulphate and 60 to 90 ml/l concentrated sulphuric acid. Differential etching takes place in a system using a spray pressure of about 3 bar, a circuit board velocity of about 1.5 m/min. and at room temperature (about 25° C.). FIG. 1G shows the final circuit board structure. The printed circuit board is then visually and electrically tested.

Printed circuit boards manufactured according to the invention may achieve a copper layer thickness distribution which deviates by less than 3 percent from the mean value. for example, at a copper layer thickness of 300 nm, the deviation is less than 9 nm. Furthermore, printed circuit boards may be produced with conductor widths and spacings of less than 100 microns and conductor height to width ratios of approximately 1:3. Finally, the printed circuit boards produced are not subject to dissipation and are particularly suitable for special applications.

While the invention has been described with respect to a preferred embodiment thereof, it will be understood by those skilled in the art that various changes in detail may be made therein without departing from the spirit, scope, and teaching of the invention. For example, the process need not be used to produce printed circuits on both sides of a circuit board. Also, materials and chemicals other than those herein described may be used so long as they are compatible with the process. If, for example, a conductor other than copper is to be used, the etchants and deposition parameters would be adjusted according to the substitute conductor. Also, the sputtered conductor and electroplated conductor need not be the same material. Accordingly, the invention herein disclosed is to be limited only as specified in the following claims.

What is claimed is:

1. A process for producing printed circuits comprising the steps of:
   sputtering a conductor onto an insulating substrate surface and the walls of through holes therein;
   applying a layer of photoresist to the insulating substrate surface;
   photolithographically creating channels in the photoresist;
   depositing a conductor in the channels and on the walls of the through holes by electroplating;
   stripping the photoresist; and
   differentially etching to remove the sputtered conductor exposed by the stripping of the photoresist.

2. The process of claim 1 wherein the steps are simultaneously implemented on both sides of the insulating substrate.

3. A process for producing printed circuits comprising the steps of:
   laminating a sacrificial layer to an insulating substrate surface;
   drilling through holes in the insulating substrate;
   etching the sacrificial layer off of the insulating substrate surface;
   sputtering a conductor onto the insulating substrate surface and the walls of the through holes therein;
   applying a layer of photoresist to the insulating substrate surface;
   exposing and developing the photoresist to create channels in the photoresist;
   depositing a conductor in the channels and on the walls of the through holes by electroplating;
   stripping the photoresist; and
   differentially etching to remove the sputtered conductor exposed by the stripping of the photoresist.

4. The process of claim 3 wherein the steps, except for the drilling of through holes, are simultaneously implemented on both sides of the insulating substrate.

5. A process for producing printed circuits comprising the steps of:
   laminating a sacrificial copper layer to the surface of a prepreg substrate;
   drilling through holes in the substrate;
   etching the sacrificial layer off of the substrate surface;
   sputtering copper onto the substrate surface and the walls of the through holes therein;
   applying a layer of photoresist to the substrate surface;
   exposing and developing the photoresist to create channels in the photoresist;
   depositing more copper in the channels and on the walls of the through holes by electroplating;
   stripping the photoresist; and
   differentially etching to remove the sputtered copper exposed by the stripping of the photoresist.

6. The process of claim 5 wherein the steps, except for the drilling of through holes, are simultaneously implemented on both sides of the substrate.

7. The process of claim 5 wherein said lamination of the sacrificial layer occurs at approximately 190° C. to produce a layer of copper of approximately 0.0175 to 0.03 mm in thickness.

8. The process of claim 5 wherein said etch to remove the sacrificial layer occurs in a high-pressure spray system.

9. The process of claim 5 wherein said sputtering of copper occurs in a magnetron-enhanced high-power cathode sputtering system to produce a layer approximately 80 to 500 nm in thickness.

10. The process of claim 9 wherein said sputtering of copper produces a layer of approximately 200 nm in thickness.

11. The process of claim 5 wherein said application of the photoresist occurs by lamination at a temperature of approximately 110° to 120° C.

12. The process of claim 11 wherein the photoresist is a negative photoresist comprising polyethylene terephthalate, benzophenone, and an acryl acid/styrol polymer.

13. The process of claim 5 wherein said developing of the photoresist occurs in an aqueous alkaline solution.

14. The process of claim 5 wherein said deposition of copper by electroplating occurs in a bath containing 15 to 25 g/l $Cu^{2+}$, 170 to 200 g/l $H_2SO_4$, 40 to 60 mg/l $Cl^-$.

15. The process of claim 14 wherein said deposition of copper by electroplating occurs at a current density of approximately 2.5 $A/dm^2$ to yield a deposition rate of approximately 25 to 30 microns/h.

16. The process of claim 5 wherein said stripping of the photoresist occurs in an aqueous alkaline solution.

17. The process of claim 5 wherein said differential etching of the sputtered copper occurs in a solution containing approximately 100 to 130 g/l sodium peroxodisulphate and approximately 60 to 90 ml/l concentrated sulphuric acid.

* * * * *